(12) United States Patent
Wu et al.

(10) Patent No.: US 6,803,262 B2
(45) Date of Patent: Oct. 12, 2004

(54) PROCESS USING SELF-ORGANIZABLE POLYMER

(75) Inventors: Yiliang Wu, Mississauga (CA); Beng S. Ong, Mississauga (CA)

(73) Assignee: Xerox Corporation, Stamford, CT (US)

( * ) Notice: Subject to any disclaimer, the term of this patent is extended or adjusted under 35 U.S.C. 154(b) by 15 days.

(21) Appl. No.: 10/273,901

(22) Filed: Oct. 17, 2002

(65) Prior Publication Data

US 2004/0077122 A1 Apr. 22, 2004

(51) Int. Cl.[7] .......................... H01L 21/00; H01L 21/84
(52) U.S. Cl. ...................... 438/149; 438/150; 438/151
(58) Field of Search ................................ 438/149–168

(56) References Cited

U.S. PATENT DOCUMENTS

| 6,626,566 | B2 | * | 9/2003 | Holmes et al. ............... 257/59 |
| 2003/0059987 | A1 | * | 3/2003 | Sirringhaus et al. ........ 438/149 |
| 2003/0136958 | A1 | * | 7/2003 | Ong et al. .................... 257/40 |
| 2003/0144466 | A1 | * | 7/2003 | Ong et al. .................. 528/397 |
| 2003/0160234 | A1 | * | 8/2003 | Ong et al. .................... 257/40 |
| 2003/0164495 | A1 | * | 9/2003 | Ong et al. .................... 257/40 |

FOREIGN PATENT DOCUMENTS

WO    WO 00/79617 A1    12/2000

OTHER PUBLICATIONS

F. Brustolin et al., "Highly Ordered Structures of Amphiphilic Polythiophenes in Aqueous Media," *Macromolecules*, vol. 35, pp. 1054–1059 (published on web Jan. 3, 2002).

G. Dufresne et al., "Thermochromic and Solvatochromic Conjugated Polymers by Design," *Macromolecules*, vol. 33, pp. 8252–8257 (published on web Sep. 30, 2000).

M. Leclerc, Optical and Electrochemical Transducers Based on Functionalized Conjugated Polymers, *Adv. Mater.*, vol. 11, No. 18, pp. 1491–1498 (1999).

Yiliang Wu et al., U.S. Ser. No. 10/273,896(filed on the same day as the present application), filed on Oct. 17, 2002, titled "Process and Device Using Gelable Composition".

* cited by examiner

*Primary Examiner*—Ha Tran Nguyen
*Assistant Examiner*—Jennifer M. Kennedy
(74) *Attorney, Agent, or Firm*—Zosan S. Soor

(57) ABSTRACT

A process including:
  creating a composition composed of a liquid and a self-organizable polymer at least partially dissolved in the liquid, resulting in dissolved polymer molecules;
  reducing the solubility of the dissolved polymer molecules to induce formation of structurally ordered polymer aggregates in the composition;
  depositing a layer of the composition including the structurally ordered polymer aggregates; and
  drying at least partially the layer to result in a structurally ordered layer, wherein the structurally ordered layer is part of an electronic device and the structurally ordered layer exhibits increased charge transport capability.

14 Claims, 2 Drawing Sheets

PROCESS USING SELF-ORGANIZABLE POLYMER

BACKGROUND OF THE INVENTION

Polymer thin film transistors have potential applications as key elements of integrated circuits for optoelectronic devices based on solution processing to lower manufacturing cost. Polymer thin film transistors generally have lower electrical performance such as lower mobility than do their silicon counterparts such as crystalline silicon or polysilicon thin film transistors. Nevertheless, the electrical performance levels of polymer thin film transistors may be sufficient for many applications, particularly large-area devices such as active matrix liquid crystal display, electronic paper, and certain low-end microelectronics such as smart cards, radio frequency identification tags, and the like, where high switching speeds may not be required. For these applications, low cost is particularly important. One main approach to obtaining higher charge carrier mobility for polymer thin film transistors is to achieve higher degrees of structural order in the active semiconducting polymer layer. PCT WO 00/79617 A1 discloses the alignment of the polymer chains parallel to each other by bringing the polymer into a liquid-crystalline phase. There is a need, which the present invention addresses, for new techniques applicable to the fabrication of electronic devices to induce increased structural order in semiconducting polymers.

The following documents also may be relevant:

F. Brustolin et al., "Highly Ordered Structures of Amphiphilic Polythiophenes in Aqueous Media," *Macromolecules*, Vol. 35, pp. 1054–1059 (published on web Jan. 3, 2002).

G. Dufresne et al., "Thermochromic and Solvatochromic Conjugated Polymers by Design," *Macromolecules*, Vol. 33, pp. 8252–8257 (published on web Sep. 30, 2000).

M. Leclerc, "Optical and Electrochemical Transducers Based on Functionalized Conjugated Polymers, *Adv. Mater.*, Vol. 11, No. 18, pp. 1491–1498 (1999).

Yiliang Wu et al., U.S. Ser. No. 10/273,896 filed on the same day as the present application).

SUMMARY OF THE INVENTION

The present invention is accomplished in embodiments by providing a process comprising:

creating a composition comprising a liquid and a self-organizable polymer at least partially dissolved in the liquid, resulting in dissolved polymer molecules;

reducing the solubility of the dissolved polymer molecules to induce formation of structurally ordered polymer aggregates in the composition;

depositing a layer of the composition including the structurally ordered polymer aggregates; and drying at least partially the layer to result in a structurally ordered layer, wherein the structurally ordered layer is part of an electronic device and the structurally ordered layer exhibits increased charge transport capability.

There are also provided in embodiments a process comprising:

creating a composition comprising a liquid and a self-organizable polymer at least partially dissolved in the liquid, resulting in dissolved polymer molecules, wherein the polymer is polythiophene;

reducing the solubility of the dissolved polymer molecules to induce formation of structurally ordered polymer aggregates in the composition, wherein the reducing the solubility of the dissolved polymer molecules is accomplished by adding a different liquid that is less capable of dissolving the polymer than the liquid;

depositing a layer of the composition including the structurally ordered polymer aggregates; and drying at least partially the layer to result in a structurally ordered layer, wherein the structurally ordered layer is part of an electronic device and the structurally ordered layer exhibits increased charge transport capability.

There are further provided in embodiments a thin film transistor comprising:

an insulating layer;

a gate electrode;

a structurally ordered semiconductor layer;

a source electrode; and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, wherein the semiconductor layer is prepared by a process comprising:

creating a composition comprising a liquid and a self-organizable polymer at least partially dissolved in the liquid, resulting in dissolved polymer molecules;

reducing the solubility of the dissolved polymer molecules to induce formation of structurally ordered polymer aggregates in the composition;

depositing a layer of the composition including the structurally ordered polymer aggregates; and drying at least partially the layer resulting in the structurally ordered semiconductor layer, wherein the structural order of the semiconductor layer increases the charge transport capability of the semiconductor layer.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

Figure 1:
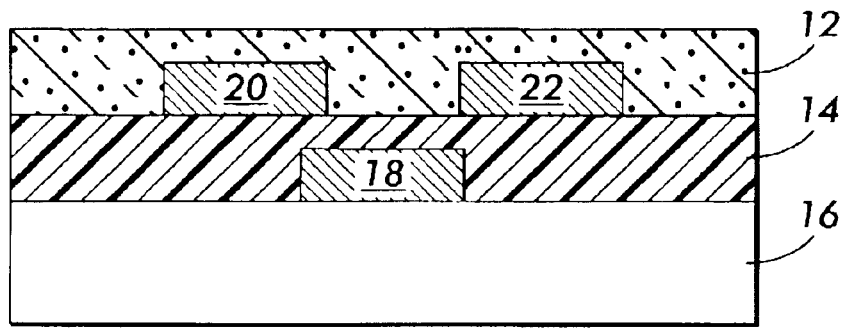
FIG. 1 represents a first embodiment of a thin film transistor made using the present process.

Any suitable self-organizable polymer which is capable of increased structural order in response to reduced solubility of the polymer in a selected liquid may be used in the present invention. Molecular self-organization refers to the ability of molecules to organize themselves into a higher molecular and intermolecular structural order in response to a stimulus such as solvency in a liquid. In embodiments, one, two, three, or more self-organizable polymers may be used. The self-organizable polymer may or may not precipitate in the liquid. In embodiments of the present invention, there is absent any gelling of the composition comprised of the self-organizable polymer and the liquid.

The polymer may be considered to exhibit poor solubility in a liquid when the concentration of the polymer in a saturated solution in that liquid is not high enough to make a thin polymer layer that is useful for the intended applications by common deposition techniques. Generally, when the concentration of the polymer in a particular liquid is below about 0.1 percent by weight, its solubility in that liquid is deemed to be poor. Even though the polymer may exhibit low solubility in a liquid at room temperature, its solubility can generally be increased by heating above room temperature.

When the concentration is higher than about 0.2 percent by weight, the polymer is considered to exhibit reasonable solubility as a useful thin polymer layer may be fabricated from this solution using common deposition processes.

The phrase "room temperature" refers to a temperature ranging from about 22 to about 25 degrees C.

In embodiments, the self-organizable polymer may be a conjugated polymer such as for instance polythiophenes, polyphenylenes, polyphenylene derivatives, polyfluorenes, fluorene copolymers, and ladder polymers.

Exemplary polythiophenes include for instance the following:

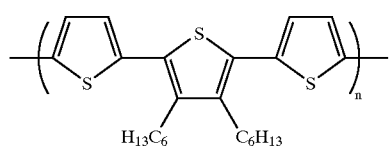 (1)

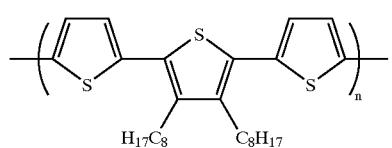 (2)

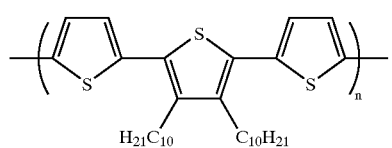 (3)

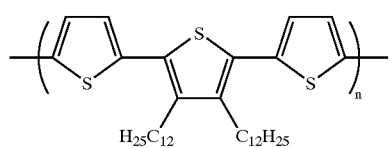 (4)

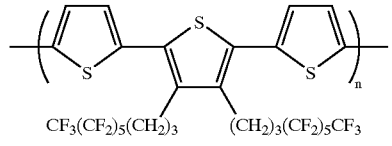 (5)

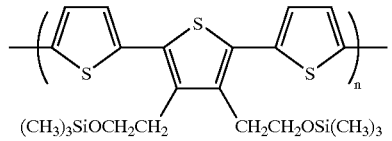 (6)

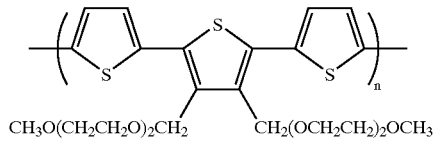 (7)

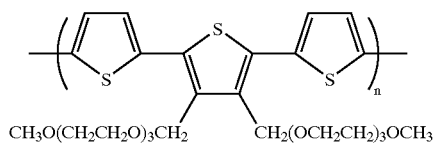 (8)

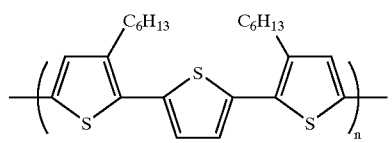 (9)

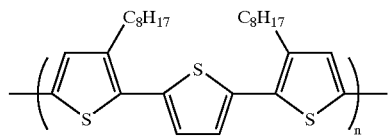 (10)

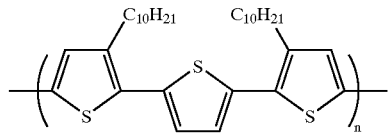 (11)

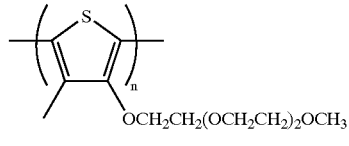 (12)

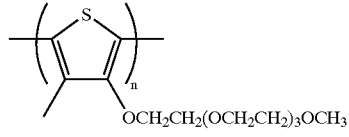 (13)

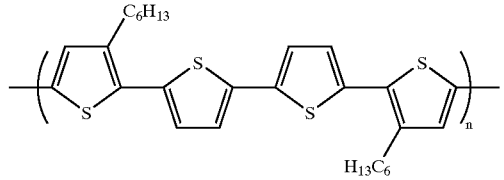 (14)

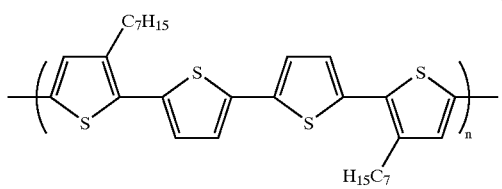 (15)

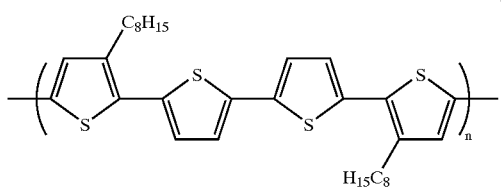 (16)

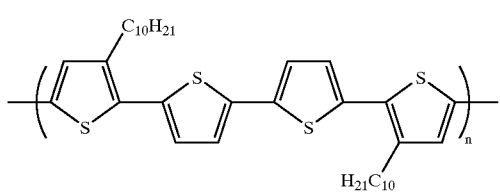 (17)

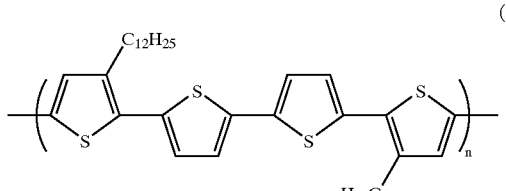 (18)

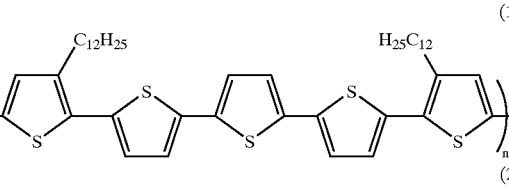 (19)

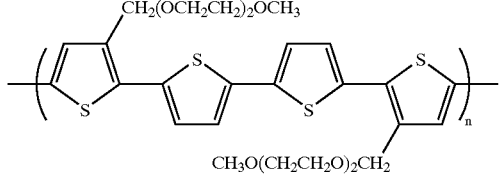 (20)

where n is from about 5 to about 5,000. Suitable polythiophenes are disclosed in U.S. Ser. No. 10/042,356, U.S. Ser. No. 10/042,358, and U.S. Ser. No. 10/042,342, the disclosures of which are totally incorporated herein by reference.

Exemplary polyphenylenes and polyphenylene derivatives include for instance the following:

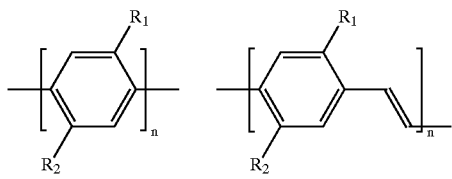

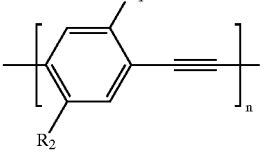

where n is from about 5 to about 5,000; $R_1$ and $R_2$ may be the same or different from each other and are a side chain comprised of, for example, alkyl derivatives such as alkoxyalkyl and siloxy-subsituted alkyl, perhaloalkyl such as perfluoroalkyl, polyether such as oligoethylene oxide, polysiloxy derivatives, and the like, containing from about 4 to about 50 atoms. Exemplary polyphenylenes, and polyphenylene derivatives such as poly(phenylene vinylene)s and poly(phenylene ethynylene)s, are disclosed in "The electroluminescence of organic materials" by U. Mitschke and P. Bäuerle, *J. Mater. Chem.* (2000), Vol. 10, pp. 1471–1507, and "Light-Emitting Characteristics of Conjugated Polymers" by H. S. Shim and J. I. Jin, *Advance in Polymer Science* (2002), Vol. 158, pp. 193–243, the disclosures of which are totally incorporated herein by reference.

Exemplary polyfluorenes and fluorene copolymers include for instance the following:

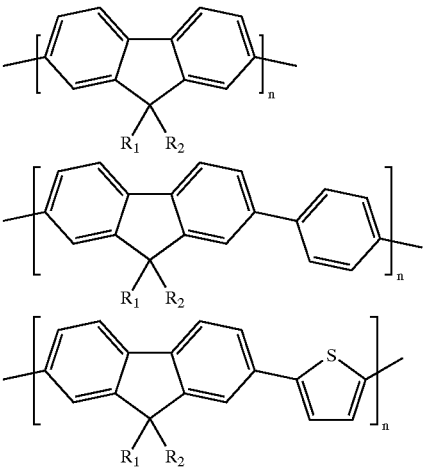

where n is from about 5 to about 5,000; $R_1$ and $R_2$ may be the same or different from each other and are hydrogen or a side chain comprised of, for example, alkyl derivatives such as alkoxyalkyl and siloxy-subsituted alkyl, perhaloalkyl such as perfluoroalkyl, polyether such as oligoethylene oxide, polysiloxy derivatives, and the like, containing from about 4 to 50 atoms. Exemplary polyfluorenes and fluorene copolymers are disclosed in "New Well-Defined Poly(2,7-fluorene) Derivatives: Photoluminescence and Base Doping," by M. Ranger, D. Rondeau, M. Leclerc, *Macromolecules* (1997), Vol. 30, pp. 7686–7691 and U.S. Pat. No. 6,204,515 B1, the disclosures of which are totally incorporated herein by reference.

Exemplary ladder polymers include for instance ladder-type polyphenylene and ladder-type polyacene

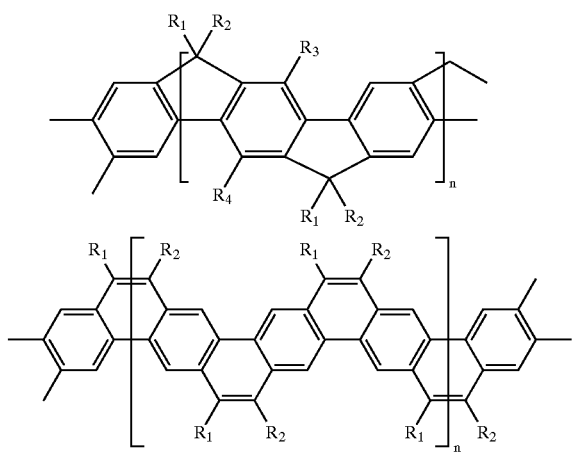

where n is from about 5 to about 5,000; $R_1$, $R_2$, $R_3$, and $R_4$ may be the same or different from each other and are a side chain comprised of, for example, alkyl derivatives such as alkoxyalkyl and siloxy-subsituted alkyl, perhaloalkyl such as perfluoroalkyl, polyether such as oligoethylene oxide, polysiloxy derivatives, alkyl or alkoxyalkyl-substituted phenylene, and the like, containing from about 4 to 60 atoms. Exemplary ladder polymers are disclosed in "Ladder-type materials" by U. Scherf, *J. Mater. Chem.* (1999), Vol. 9, pp. 1853–1864, the disclosure of which is totally incorporated herein by reference.

The polymer or polymers are completely dissolved or partially dissolved in a liquid prior to the reducing the solubility of the polymer or polymers in the liquid. Stirring may be optionally employed to aid the dissolution. Undissolved polymer may be optionally removed by filtration. The amount of the polymer dissolved in the liquid may range for example from about 0.1% to as much as about 50% by weight of the polymer. In embodiments, the concentration of the polymer in the liquid ranges for example from about 0.1% to about 30% by weight, particularly from about 0.2% to about 10% by weight, based on the total weight of the liquid and the polymer. The polymer concentrations in the liquid described above are before reducing the solubility of the polymer in the liquid.

Heat may be optionally employed to aid the dissolution of the polymer at an elevated temperature, for a period of time ranging for instance from about 1 minutes to about 24 hours, particularly from about 10 minutes to about 4 hours.

As used herein, the phrase "elevated temperature" refers to a temperature ranging from above room temperature to the boiling point or higher of the chosen liquid (at one atmosphere or higher pressure), for example from about 40 to about 180 degrees C., particularly from about 50 to about 120 degrees C.

The liquid may be a fair to excellent solvent for the polymer at room temperature or at an elevated temperature. The liquid may be for instance chloroform, tetrahydrofuran, chlorobenzene, dichlorobenzene, trichlorobenzene, nitrobenzene, toluene, xylene, mesitylene, 1,2,3,4-tetrahydronaphthelene, dichloromethane, 1,2-dichloroethane trichloroethane, 1,1,2,2,-chloroethane, or a mixture thereof.

Any suitable technique may be used to reduce the solubility of the dissolved polymer molecules in the liquid to induce the formation of structurally ordered polymer aggregates. For instance, a different liquid may be added that is less or not capable of dissolving the polymer compared to the liquid, i.e., the liquid is a better solvent than the different liquid. The different liquid is added in an amount ranging from about 1% to about 80% by volume based on the total volume of the liquid and the different liquid, for a period of time ranging for instance from about 1 minutes to about 4 hours, particularly from about 10 minutes to about 1 hour. Agitation is optionally used during addition of the different liquid. The different liquid may be for instance methanol, ethanol, isopropanol, hexane, heptane, acetone, and water. Therefore, the resultant composition is comprised of the polymer or polymers and the combination of the liquid and the different liquid which can be the combination of chlorobenzene/hexane, chlorobenzene/heptane, chloroform/methanol, tetrahydrofuran/methanol, and tetrahydrofuran/water.

In embodiments, the reducing the solubility of the dissolved polymer molecules is accomplished by changing the temperature of the composition. For example, heat may be used to aid dissolution of the polymer in the liquid at a temperature and for a time as discussed herein. Then the temperature is lowered from the elevated temperature to room temperature or by an amount ranging for instance from about 10 to about 150 degrees C., particularly from about 20 to about 100 degrees C., and wherein the lowered temperature is maintained for a period of time ranging for example from about 10 minutes to about 10 hours, particularly from about 30 minutes to about 4 hours.

Any combination of techniques can be used to reduce the solubility of the dissolved polymer molecules such as using both a different liquid and controlling the temperature as described herein.

Individual polymer molecules tend to come together in aggregate forms when their solubility in the liquid is reduced. These aggregates may be amorphous (i.e., disordered) or highly ordered in nature, depending primarily on the polymer structures, the media they are in, and the conditions under which-the-solubility-reduction occurs. The phrase "structurally ordered polymer aggregates" refers to the aggregation of polymer molecules wherein the spatial orientations or arrangements of the molecules relative to their surrounding neighboring molecules within the aggregation are orderly in nature. For instance the polymer molecules may align themselves with their backbones parallel to one another. Changes in molecular ordering of the polymer in a composition may be monitored by spectroscopic methods, for instance, absorption spectroscopy, optical spectroscopy, NMR, light scattering and X-ray diffractions analysis, and by transmission electron microscopy. A known example is regioregular poly(3-alkylthiophene-2,5-diyl)s which forms π-stacked lamellar structures as a results of its side chain alignment as disclosed in the reference, "Extensive Studies on π-Stacking of Poly(3-alkylthiophene-2,5-diyl)s and Poly(4-alkylthiazole-2,5-diyl)s by Optical Spectroscopy, NMR Analysis, Light Scattering Analysis and X-ray Crystallography" by T. Yamamoto, et al., *J. Am. Chem. Soc.* (1998), Vol 120, pp. 2047–2058. The existence of the structural order (of the polymer aggregates) is supported by for example spectroscopy where in an absorption spectrum the absorption maxima shifts toward longer wavelengths together with the appearance of absorption fine structures (e.g., vibronic splitting).

Reducing the solubility of the dissolved polymer molecules is accomplished with or without visually observable precipitation of the polymer. In embodiments, reducing the solubility of the dissolved polymer molecules is accomplished prior to the point that precipitation starts. In other embodiments, reducing the solubility of the dissolved polymer molecules is accomplished beyond the point that precipitation starts. How much of the different liquid to add or how much should the temperature drop be to reduce the solubility of the dissolved polymer molecules may be determined for example on a trial and error basis. Precipitated polymer may be optionally filtrated out prior to deposition of the layer of the composition containing the structurally ordered polymer aggregates.

Any suitable technique may be used to deposit the layer of the composition containing the structurally ordered polymer aggregates. In embodiments, solution coating may be used. The phrase "solution coating" refers to any liquid composition compatible coating technique such as spin coating, blade coating, rod coating, screen printing, ink jet printing, stamping and the like.

During the depositing the layer of the composition, the composition may be at any suitable temperature. In embodiments, the deposition is accomplished at a "lower temperature" below the elevated temperature. The "lower temperature" may be a temperature ranging from below room temperature to below the elevated temperature such as for example from about 10 to about 80 degrees C., particularly from about 20 to about 40 degrees C., and especially at room temperature. Where the lower temperature is below room temperature, suitable cooling apparatus may be employed to accomplish this.

The deposited layer is at least partially dried, especially completely dried, using any suitable technique to remove the liquid (and if used the different liquid). When dried, the polymer aggregates collapse together and coalesce, resulting in the formation of a continuous film. This continuous film contains structurally ordered polymer and thus corresponds to a structurally ordered layer. Drying techniques may involve for instance: directing one or more streams of air (at room temperature or at an elevated temperature) at the layer; "natural" evaporation from the layer (i.e., evaporation at room temperature without using an air stream), heating the layer while optionally applying a vacuum, or a combination of drying techniques. In embodiments where heat is employed in the drying technique, the elevated temperature may range for instance from about 40 to about 120 degrees C. at normal or reduced pressures, for a period of time ranging for instance from about 10 minutes to about 24 hours. The dry thickness of the layer is for example from about 10 nanometers to about 1 micrometer or for example from about 10 to about 150 nanometers. In embodiments, the structurally ordered layer is the semiconductor layer of an electronic device such as a thin film transistor.

In embodiments, the present process may be used whenever there is a need to form a semiconductor layer in an electronic device. The phrase "electronic device" refers to micro- and nano-electronic devices such as, for example, micro- and nano-sized transistors and diodes. Illustrative transistors include for instance thin film transistors, particularly organic field effect transistors.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
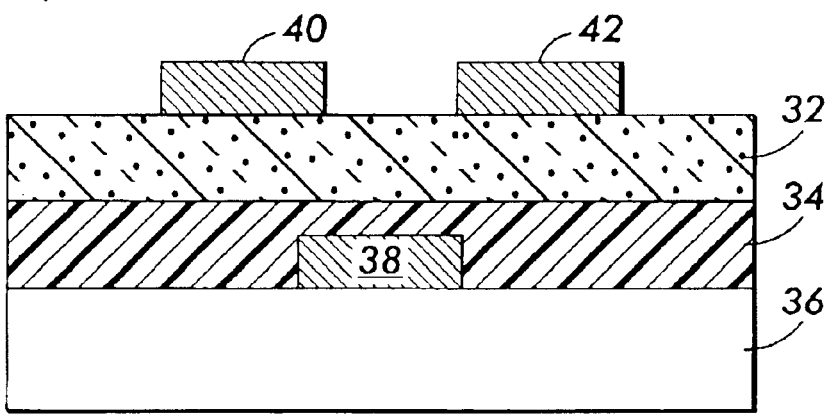
FIG. 2 represents a second embodiment of a thin film transistor made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
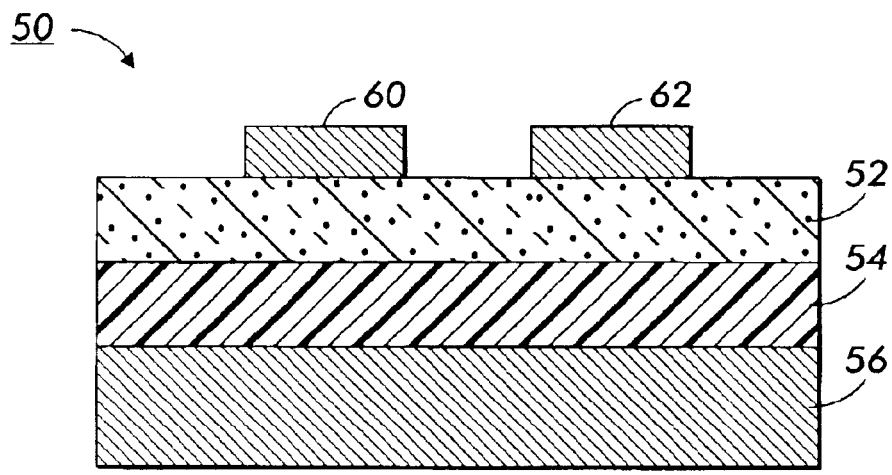
FIG. 3 represents a third embodiment of a thin film transistor made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
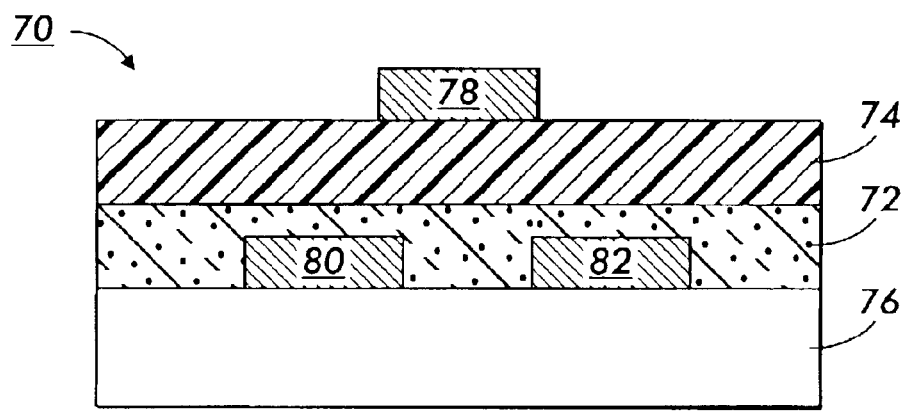
FIG. 4 represents a fourth embodiment of a thin film transistor made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The composition and formation of the semiconductor layer are described herein.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from amount 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as Electrodag available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The TFT devices contain a semiconductor channel with a width W and length L. The semiconductor channel width may be, for example, from about 1 micrometers to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

Regarding electrical performance characteristics, a semiconductor layer comprising the structurally ordered polymer has a carrier mobility greater than for example about $10^{-3}$ $cm^2/Vs$ (centimeters$^2$/Volt-second) and a conductivity less than for example about $10^{-5}$ S/cm (Siemens/centimeter). The thin film transistors produced by the present process have an on/off ratio greater than for example about $10^3$ at 20 degrees C. The phrase on/off ratio refers to the ratio of the source-drain current when the transistor is on to the source-drain current when the transistor is off.

In embodiments, the charge transport capability (that is, for drain current and/or carrier mobility) of an inventive electronic device may exceed the charge transport capability of a comparative electronic device that is prepared without inducing the increased structural order in the polymer by an amount ranging for example from about a factor of 1.5 to as much as more than an order of magnitude for each of the drain current and/or charge carrier mobility The invention will now be described in detail with respect to specific preferred embodiments thereof, it being understood that these examples are intended to be illustrative only and the invention is not intended to be limited to the materials, conditions, or process parameters recited herein. All percentages and parts are by weight unless otherwise indicated.

EXAMPLE 1 a) Synthesis of Polymer

A polythiophene, poly[2,5-bis(2-thienyl)-3,4-dioctylthiophene] (having the structural formula (2) provided earlier in the list of exemplary polythiophenes), was synthesized using the following procedure.

i) Monomer Synthesis: The monomer 2,5-bis(5-bromo-2-thienyl)-3,4-dioctylthiophene for the preparation of polythiophene (2) was synthesized as follows:

3,4-Dioctylthiophene: 2 M octylmagnesium bromide (100 milliliters, 0.2 mol) in anhydrous ethyl ether was added to a well-stirred mixture of dichloro[1,3-bis (diphenylphosphino)-propane]nickel(II) (0.2 gram) and 3,4-dibromothiophene (20.16 grams, 0.0833 mol) in 200 milliliters of anhydrous ethyl ether in a 500 milliliter round bottom flask cooled with an ice bath under an inert atmosphere. The nickel complex reacted immediately with the Grignard reagent and the resulting reaction mixture was allowed to warm up to room temperature. An exothermic reaction started within 30 minutes and the ethyl ether began to reflux gently. After stirring for another 2 hours at room temperature, the reaction mixture was refluxed for 6 hours, then cooled in an ice bath, and hydrolyzed with aqueous 2N hydrochloric acid. The organic layer was separated and washed successively with water, brine, and again with water, dried over anhydrous sodium sulfate, and filtered. After evaporation of the solvent, the residue was distilled under reduced pressure through Kugelrohr apparatus to provide 21.3 grams of 3,4-dioctylthiophene as a colorless liquid.

$^1$H NMR (CDCl$_3$): δ 6.89 (s, 2H), 2.50 (t, J=7.0 Hz, 4H), 1.64–1.58 (m, 4H), 1.40–1.28 (m, 20H), 0.89 (t, J=6.5 Hz, 6H); $^{13}$C NMR (CDCl$_3$) δ 142.1, 119.8, 31.9, 29.6 (2C), 29.5, 29.3, 28.8, 22.7, 14.1.

2,5-Dibromo-3,4-dioctylthiophene: N-bromosuccinimide (4.6 grams, 25.7 mmol) was added to a well-stirred solution of 3,4-dioctylthiophene (3.6 grams, 11.7 mmol) in a mixture of 30 milliliters of dichloromethane and 10 milliliters of acetic acid in a 100 milliliter round-bottomed flask. The reaction was monitored by thin layer chromatography and was complete in about 35 minutes. The mixture was diluted with 160 milliliters of dichloromethane and filtered to remove succinimide. The filtrate was washed with aqueous 2N sodium hydroxide solution, and then twice with water (2×100 milliliters). After drying with anhydrous sodium sulfate and removal of the solvent, 5.4 grams of 2,5-dibromo-3,4-dioctylthiophene as a light yellow liquid.

$^1$H NMR (CDCl$_3$): δ 2.50 (t, J=7.0 Hz, 4H), 1.52–1.28 (m, 24H), 0.89 (t, J=6.5 Hz, 6H).

2,5-Bis(2-thienyl)-3,4-dioctylthiophene: In a dry box under an inert atmosphere, Pd(PPh$_3$)$_2$Cl$_2$ (0.15 gram, 0.2 mmol) was added to a mixture of 2,5dibromo-3,4-dioctylthiophene (4.2 grams, 9.0 mmol) and 2-(tributylstannyl)-thiophene (7.4 grams, 19.8 mmol) in anhydrous tetrahydrofuran (50 milliliters) in a 250 milliliter round-bottomed flask. The mixture was then refluxed for 12 hours and the solvent was removed by evaporation. The crude product thus obtained was purified by flash chromatography on silica gel using hexane as eluent to give 3.1 grams of 2,5-bis(2thienyl)-3,4-dioctylthiophene.

$^1$H NMR (CDCl$_3$): δ 7.31 (dd, J=3.2, 0.5 Hz, 2H), 7.13 (dd, J=2.2, 0.5 Hz, 2H), 7.06 (dd, J=2.2, 4.5 Hz, 2H), 2.68 (dd, J=7.6, 7.6 Hz, 4H), 1.59–1.53 (m, 4H), 1.42–1.27 (m, 20H), 0.91 (t, J=6.5 Hz, 6H).

2,5-Bis(5-bromo-2-thienyl)-3,4-dioctylthiophene: N-bromo succinimide (2.8 grams, 15.7 mmol) was added to a well-stirred solution of 2,5-bis(2-thienyl)-3,4-dioctylthiophene (3.6 grams, 7.6 mmol) of N,N-dimethylformamide (30 milliliters) in a 100 milliliter round-bottomed flask cooled with an ice-bath. After addition, the mixture was allowed to warm up to room temperature slowly. The reaction was monitored by thin layer chromatography and was stopped after 3 hours of reaction. The resulting mixture was diluted with hexanes (170 milliliters) and washed with three times with 100 milliliters of water. The organic layer was separated, dried with anhydrous sodium sulfate, and vacuum evaporated to provide the crude product, which was purified by flash chromatography on silica gel using hexane as eluent to give 2.5 grams of 2,5-bis(5-bromo-2-thienyl)-3,4-dioctylthiophene.

$^1$H NMR (CDCl$_3$): δ 7.06 (d, J=3.5 Hz, 2H), 6.86 (d, J=3.5 Hz, 2H), 2.62 (dd, J=7.3, 7.3 Hz, 4H), 1.55–1.49 (m, 4H), 1.41–1.28 (m, 20H), 0.89 (t, J=6.5 Hz, 6H); $^{13}$C NMR (CDCl$_3$) δ 140.6, 137.4, 130.2, 129.3, 126.2, 112.0, 31.9, 30.8, 29.8, 29.2 (2C), 28.1, 22.7, 14.2.

Poly[2,5-bis(2-thienyl)-3,4-dioctylthiophene] (2): A well stirred suspension of freshly prepared Reike Zn (0.28 gram, 4.29 mmol) in anhydrous tetrahydrofuran (20 milliliters)

under an inert atmosphere was added dropwise to a solution of 2,5-bis(5bromo-2-thienyl)-3,4-dioctylthiophene (2.46 grams, 3.9 mmol) in anhydrous tetrahydrofuran (10 milliliters), and the mixture was permitted to react for 45 minutes at room temperature. Subsequently, a suspension of Ni(dppe)Cl$_2$ (0.021 gram, 0.04 mmol) in anhydrous tetrahydrofuran (35 milliliters) was carefully added. The reaction mixture was heated at 60° C. for 3 hours and then poured into 2N hydrochloric acid solution in methanol. The precipitated polythiophene product was filtered, redissolved in 70 milliliters of hot tetrahydrofuran, and precipitated from 2N ammonia solution in methanol. This procedure was repeated twice to remove the acid and oligomers. After drying in vacuo at room temperature, 1.6 grams of poly[2,5-bis(2-thienyl)-3,4-dioctylthiophene] (2), $M_w$, 41,900, $M_n$, 11,800 K, Tm, 180° C. resulted.

$^1$H NMR (CDCl$_3$): δ 7.30, 7.13, 7.05, 2.73, 1.59, 1.45, 1.29, 0.89; $^{13}$C NMR (CDCl$_3$) δ 140.4, 136.7, 135.1, 129.8, 126.4, 123.9, 31.9, 30.7, 29.9, 29.3, 28.3, 22.7, 14.2.

b) Inducing Molecular Self-organization

The polymer was first dissolved in chlorobenzene which was a good solvent at 2 weight percent level. The solution was filtered through a 0.2 μm syringe filter. A poor solvent such as hexane was then added slowly under shaking or stirring in an amount of about 50% by volume. No precipitation of the polymer was observed. The mixture (polymer, chlorobenzene, and hexane) was very stable. It can be stored at room temperature for weeks without precipitation. This mixture is ready for device fabrication.

Light absorbance and light wavelength were plotted on a graph to demonstrate solvatochromism of the polymer. A longer wavelength shoulder was noted in its solution absorption spectrum after hexane addition and was more pronounced with a red shift as more hexane was added. The red shift is due to the coplanar conformation of the polymer chain with strong interchain interactions induced by addition of hexane.

c) TFT Device Fabrication and Characterization

A bottom-contact thin film transistor structure, as schematically described by FIG. 1, was chosen as the primary test device configuration in this example. The bottom-contact test device was comprised of a series of photolithographically pre-patterned transistor dielectric layers and electrodes with defined channel widths and lengths on a glass substrate. The gate electrode on the glass substrate was comprised of chromium of about 80 nanometers in thickness. The insulating layer was a 300 nanometers thick silicon nitride having a capacitance of about 22 nF/cm$^2$ (nanofarads/square centimeter). On top of said insulating layer were coated by vacuum deposition the source and drain contacts comprised of gold of about 100 nanometers in thickness. The polythiophene semiconductor layer of about 30 nanometers to 100 nanometers in thickness was then deposited by spin coating from the composition (polymer, chlorobenzene, and hexane). The spin coating was accomplished at a spinning speed of 1,000 rpm for about 35 seconds. The resulting coated device was dried in vacuo at 80° C. for 20 hours, and was then ready for evaluation.

The evaluation of field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

An important property for the thin film transistor is its current on/off ratio, which is the ratio of the saturation source-drain current when the gate voltage $V_G$ is equal to or greater than the drain voltage $V_D$ to the source-drain current when the gate voltage $V_G$ is zero.

At least five thin film transistors were prepared with dimensions of W (width)=1,000 μm and L (length)=5 μm.

Comparative Example 1

At least five thin film transistors were prepared using the same procedures of Example 1 except that the polythiophene semiconductor layer was deposited from pure good solvent, chlorobenzene (that is, no hexane was added).

The following average properties from at least five transistors of Example 1 and from at least five transistors of Comparative Example 1 were obtained:

| Solvent | Mobility (cm$^2$/V · s) | On/off ratio |
|---|---|---|
| Chlorobenzene (Comp. Ex. 1) | 0.7 × 10$^{-4}$ | ~10$^3$ |
| Chlorobenzene/Hexane (Example 1) | 1.3 × 10$^{-3}$ | ~10$^4$ |

A dramatic performance enhancement was observed in Example 1. Both the field effect mobility and current on/off ratio were improved by an order of magnitude.

We claim:

1. A process comprising:
   creating a composition comprising a liquid and a self-organizable polymer at least partially dissolved in the liquid, resulting in dissolved polymer molecules;
   reducing the solubility of the dissolved polymer molecules to induce formation of structurally ordered polymer aggregates in the composition;
   depositing a layer of the composition including the structurally ordered polymer aggregates; and
   drying at least partially the layer to result in a structurally ordered layer, wherein the structurally ordered layer is part of an electronic device and the structurally ordered layer exhibits increased charge transport capability.

2. The process of claim 1, wherein the reducing the solubility of the dissolved polymer molecules is accomplished without visually observable precipitation.

3. The process of claim 1, wherein the reducing the solubility of the dissolved polymer molecules is accomplished with visually observable precipitation.

4. The process of claim 1, wherein the reducing the solubility of the dissolved polymer molecules is accomplished by changing the temperature of the liquid phase.

5. The process of claim 1, wherein the reducing the solubility of the dissolved polymer molecules is accomplished by adding a different liquid that is less capable of dissolving the polymer than the liquid.

6. The process of claim 5, wherein the different liquid is added in an amount ranging from about 1% to about 80% by volume based on the total volume of the liquid and the different liquid.

7. The process of claim 1, wherein the polymer is a conjugated polymer.

8. The process of claim 1, wherein the polymer is a polythiophene.

9. The process of claim 1, wherein the electronic device is a thin film transistor and the structurally ordered layer is a semiconductor layer.

10. A process comprising:

creating a composition comprising a liquid and a self-organizable polymer at least partially dissolved in the liquid, resulting in dissolved polymer molecules, wherein the polymer is polythiophene;

reducing the solubility of the dissolved polymer molecules to induce formation of structurally ordered polymer aggregates in the composition, wherein the reducing the solubility of the dissolved polymer molecules is accomplished by adding a different liquid that is less capable of dissolving the polymer than the liquid;

depositing a layer of the composition including the structurally ordered polymer aggregates; and drying at least partially the layer to result in a structurally ordered layer, wherein the structurally ordered layer is part of an electronic device and the structurally ordered layer exhibits increased charge transport capability.

11. The process of claim 10, wherein the reducing the solubility of the dissolved polymer molecules is accomplished without visually observable precipitation.

12. The process of claim 10, wherein the reducing the solubility of the dissolved polymer molecules is accomplished with visually observable precipitation.

13. The process of claim 10, wherein the different liquid is added in an amount ranging from about 1% to about 80% by volume based on the total volume of the liquid and the different liquid.

14. The process of claim 10, wherein the electronic device is a thin film transistor and the structurally ordered layer is a semiconductor layer.

* * * * *

UNITED STATES PATENT AND TRADEMARK OFFICE
CERTIFICATE OF CORRECTION

PATENT NO. : 6,803,262 B2
APPLICATION NO. : 10/273901
DATED : October 12, 2004
INVENTOR(S) : Wu et al.

It is certified that error appears in the above-identified patent and that said Letters Patent is hereby corrected as shown below:

In column 1, the following section should be added before the section title BACKGROUND OF THE INVENTION:

--STATEMENT REGARDING FEDERALLY SPONSORED RESEARCH OR DEVELOPMENT
   This invention was made with United States Government support under Cooperative Agreement No. 70NANBOH3033 awarded by the National Institute of Standards and Technology (NIST). The United States Government has certain rights in the invention.--

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,803,262 B2 |
| APPLICATION NO. | : 10/273901 |
| DATED | : October 12, 2004 |
| INVENTOR(S) | : Wu et al. |

It is certified that error appears in the above-identified patent and that said Letters Patent is hereby corrected as shown below:

In the Specification

In column 1, the following section should be added before the section title BACKGROUND OF THE INVENTION:

--STATEMENT REGARDING FEDERALLY SPONSORED RESEARCH OR DEVELOPMENT
   This invention was made with United States Government support under Cooperative Agreement No. 70NANB0H3033 awarded by the National Institute of Standards and Technology (NIST). The United States Government has certain rights in the invention.--

This certificate supersedes the Certificate of Correction issued March 6, 2007.

Signed and Sealed this
Tenth Day of September, 2013

Teresa Stanek Rea
*Acting Director of the United States Patent and Trademark Office*